United States Patent
Yamashita et al.

(10) Patent No.: US 7,173,447 B2
(45) Date of Patent: Feb. 6, 2007

(54) METHOD AND APPARATUS FOR DIAGNOSING FAULT IN SEMICONDUCTOR DEVICE

(75) Inventors: Masatsugu Yamashita, Wako (JP); Kodo Kawase, Wako (JP); Masayoshi Tonouchi, Suita (JP); Toshihiro Kiwa, Suita (JP); Kiyoshi Nikawa, Kanagawa (JP)

(73) Assignees: Riken, Saitama (JP); NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/038,485

(22) Filed: Jan. 21, 2005

(65) Prior Publication Data

US 2006/0006886 A1   Jan. 12, 2006

(30) Foreign Application Priority Data

Jul. 8, 2004   (JP)   ............................. 2004-202019

(51) Int. Cl.
   *G01R 31/26*   (2006.01)
(52) U.S. Cl. .................... 324/765; 324/750; 324/158.1
(58) Field of Classification Search ................ 324/765, 324/750–752, 501, 158.1; 438/14, 16; 250/310, 250/311
   See application file for complete search history.

(56) References Cited

U.S. PATENT DOCUMENTS

| | | | | |
|---|---|---|---|---|
| 5,501,637 A | * | 3/1996 | Duncan et al. | 374/126 |
| 5,548,211 A | * | 8/1996 | Tujide et al. | 324/158.1 |
| 5,553,939 A | * | 9/1996 | Dilhac et al. | 374/1 |
| 5,872,630 A | * | 2/1999 | Johs et al. | 356/369 |
| 5,936,734 A | * | 8/1999 | Johs et al. | 356/364 |
| 6,211,517 B1 | * | 4/2001 | Pasch | 250/310 |
| 6,633,432 B2 | * | 10/2003 | Iketaki | 359/386 |
| 6,673,637 B2 | * | 1/2004 | Wack et al. | 438/14 |
| 6,888,632 B2 | * | 5/2005 | Smith | 356/369 |
| 6,952,271 B2 | * | 10/2005 | Niu et al. | 356/625 |
| 6,980,010 B2 | * | 12/2005 | Tonouchi et al. | 324/750 |

FOREIGN PATENT DOCUMENTS

JP   10-135413   5/1998

OTHER PUBLICATIONS

"Electron Microscope Q and A".
Patent Abstracts of Japan (related to JP 10-135413).

* cited by examiner

*Primary Examiner*—Jermele Hollington
*Assistant Examiner*—Arleen M. Vazquez
(74) *Attorney, Agent, or Firm*—Griffin & Szipl, P.C.

(57) ABSTRACT

An apparatus for diagnosing a fault in a semiconductor device includes an laser applying unit, a detection/conversion unit, and a fault diagnosis unit. The semiconductor device is held at a state where no bias voltage is applied thereto. The laser applying unit then applies a pulse laser beam having a predetermined wavelength to the semiconductor device so as to two-dimensionally scan the semiconductor device with the pulse laser beam. The detection/conversion unit detects an electromagnetic wave generated from a laser applied position in the semiconductor device, and converts the detected electromagnetic wave into a time-varying voltage signal that corresponds to a time-varying amplitude of an electric field of the electromagnetic wave. The fault diagnosis unit derives an electric field distribution in the semiconductor device on the basis of the time-varying voltage signal to perform fault diagnosis on the semiconductor device.

15 Claims, 5 Drawing Sheets

ILLUSTRATION OF SEMICONDUCTOR BAND $E_F$: FERMI LEVEL

METHOD AND APPARATUS FOR DIAGNOSING FAULT IN SEMICONDUCTOR DEVICE

This application claims priority from Japanese Patent Application No. 202019/2004, filed Jul. 8, 2004, the entire disclosure of which is incorporated herein by reference.

BACKGROUND OF THE INVENTION

1. Technical Field of the Invention

The present invention relates to a method and an apparatus for diagnosing a fault in a semiconductor device, and more particularly to a non-contact method and a non-contact apparatus for diagnosing a fault in a semiconductor device by obtaining a two-dimensional electric field vector distribution in the semiconductor device. Photoexcitation is performed on the semiconductor device, and the radiant electromagnetic wave is then detected to obtain the electric field vector distribution.

2. Description of the Related Art

A technology of inspecting a semiconductor device without breaking the semiconductor device is used for detecting a defective PN-junction, a position of electrical wire breaking, short circuit or high resistance to perform quality analysis or defect analysis on the semiconductor device as described in Reference (Shigeo Horiuchi et al., "Electron Microscope Q & A", p. 48, published by Agune Shohusha Co., Ltd. (Dec. 15, 1996)).

Figure 1:
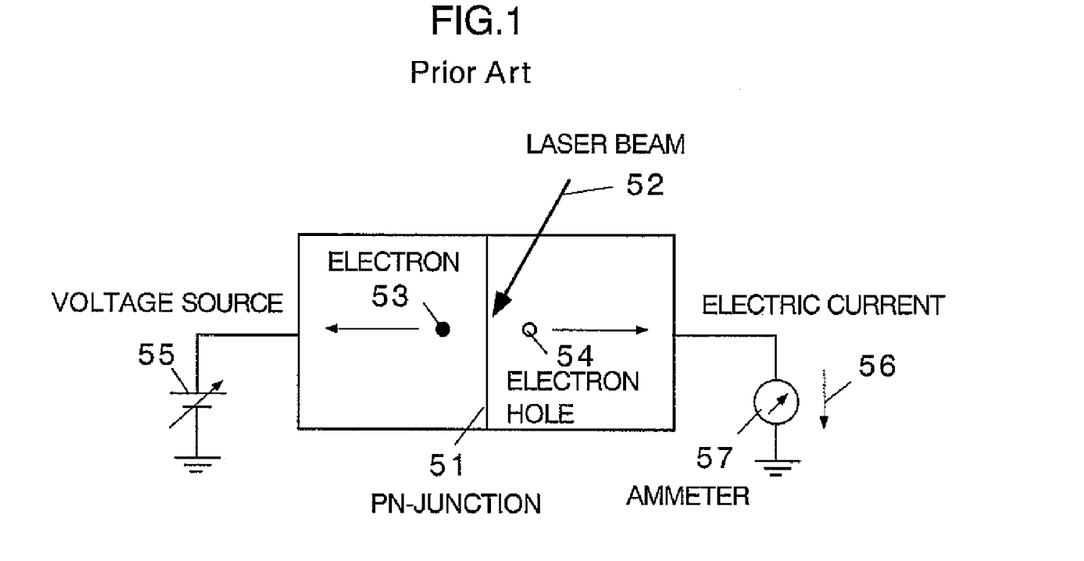
FIG. 1 shows a principle of a method of inspecting a semiconductor device without breaking the semiconductor device in a related art.

FIG. 1 shows a principle of a conventional method of inspecting a semiconductor device without breaking the semiconductor device. When a PN-junction 51 is irradiated with a laser beam 52, a pair of an electron 53 and a hole 54 is generated. The electron and the hole of this pair flow in opposite directions to generate a current, because of an electric field at a depletion layer of the PN-junction 51 and an electric field applied from an external power source 55. The current thus flowing is an optical beam induced current (simply referred to as OBIC current, hereinafter) resulting from an OBIC phenomenon. This OBIC current 56 is detected as a current or a current change measured by an ammeter 57 which is connected in series to the PN-junction 51.

Figure 2:
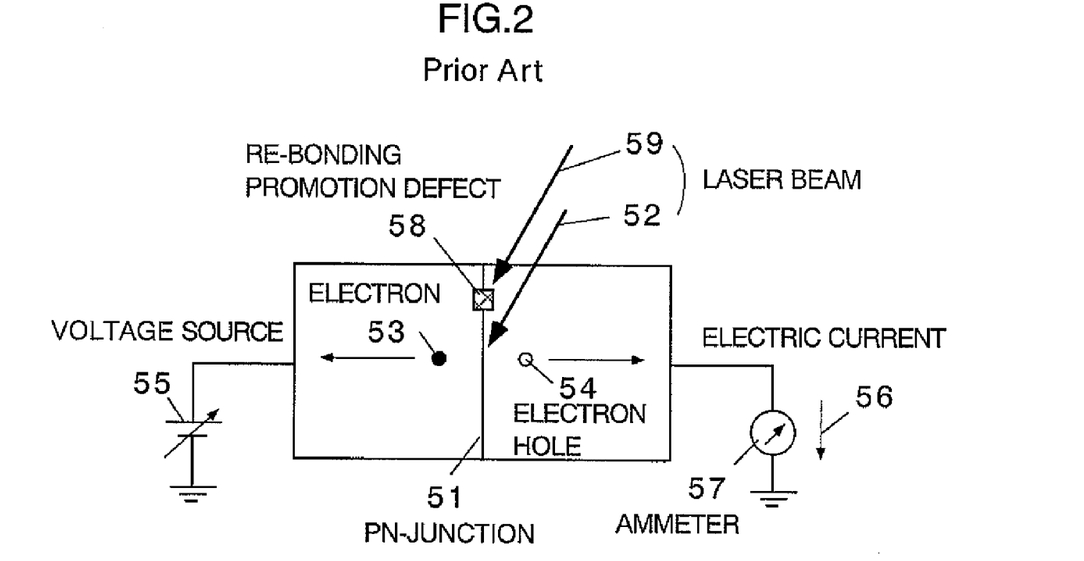
FIG. 2 shows a technique of detecting a defect in a semiconductor device by using an OBIC current.

FIG. 2 shows a conventional technique of detecting a defect by using an OBIC current in the same configuration as in FIG. 1. In FIG. 2, there is a defect 58 which promotes re-bonding of an electron and a hole at the PN-junction. When a portion having no defects is irradiated with a laser beam 52, an OBIC current flows in the same manner as in the case of FIG. 1. On the other hand, when the defect 58 which promotes the re-bonding is irradiated with a laser beam 59, even if a pair of an electron and a hole is generated, the pair is immediately re-bonded to disappear, causing no OBIC current to flow. Thus, it is possible to specify a defect position where the re-bonding is promoted.

The OBIC phenomenon at the PN-junction is used not only for detecting a defect at the PN-junction but also for detecting a position of wire breaking (as described in Japanese Laid-Open Patent Publication No. 10-135413, for example). A method of Japanese Laid-Open Patent Publication No. 10-135413 will be described with reference to FIG. 3 of a side view and FIG. 4 of a plan view.

Figure 3:
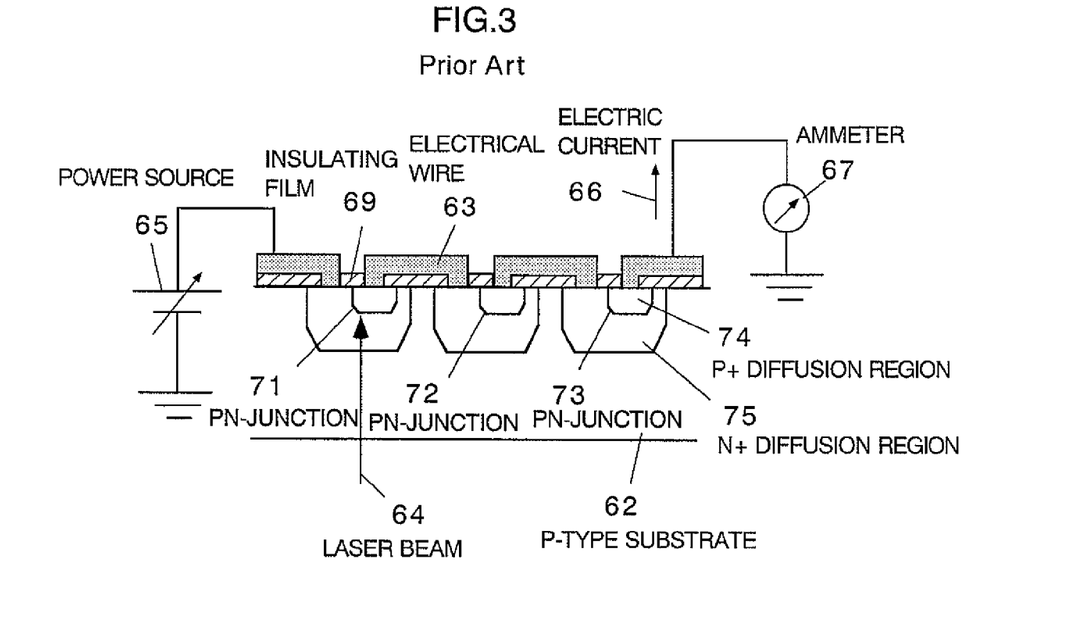
FIG. 3 is a side view showing a method according to Japanese Laid-Open Patent Publication No. 10-135413 in a related art.
Figure 4:
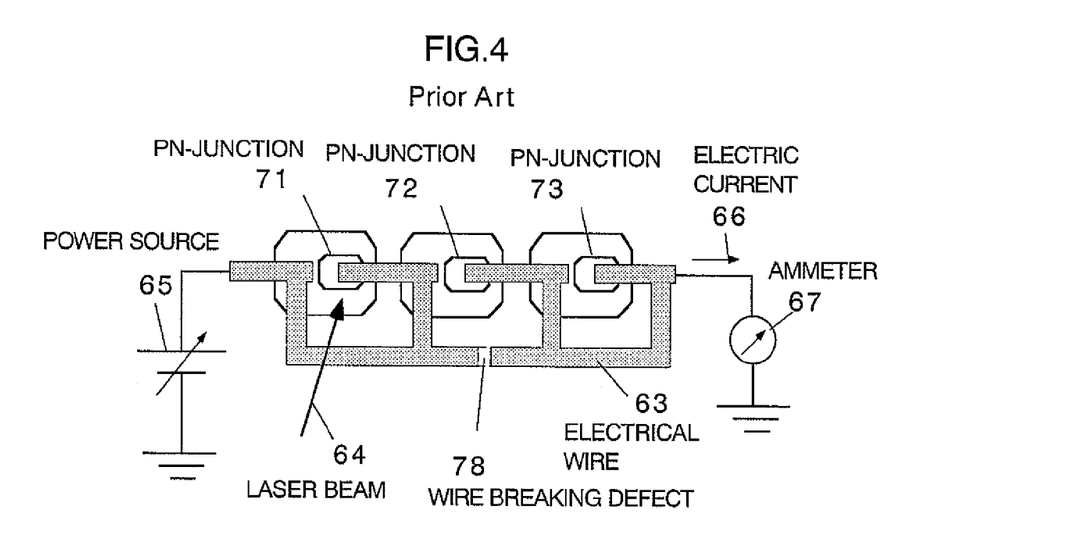
FIG. 4 is a plan view showing a method according to Japanese Laid-Open Patent Publication No. 10-135413 in a related art.

PN-junctions 71, 72 and 73 are connected in series. A wire 63 is formed in parallel with each of the PN-junctions 71, 72 and 73. When a wire breaking defect 78 exists in the wire 63, an OBIC current flowing in the PN-junction 72 connected in parallel with the wire 63 having the wire breaking 78 differs in value from OBIC currents flowing in the other PN-junctions 71 and 73 so that the wire breaking 78 can be specified. Accordingly, similarly to the wire breaking, a short circuit defect and high resistance defect in the wire can be detected by taking advantage of the abnormality in an OBIC current.

To diagnose a fault in the semiconductor device by using the conventional techniques as described above, a bias voltage has to be applied to a chip (semiconductor device). Accordingly, electrical connection to an external voltage applying device has to be formed on the chip.

For this reason, there is a problem in that a fault in a semiconductor device cannot be detected during the manufacturing process for the semiconductor device. In other words, in the case of the conventional fault diagnosing, it is very difficult (practically impossible) to form electrical connection on the chip during the manufacturing process. Thus, it is impossible to detect a fault in the semiconductor device in a state where no bias voltage is applied to the semiconductor device during the manufacturing process.

SUMMARY OF THE INVENTION

The present invention was made in order to solve the above-described problems. Namely, it is an object of the present invention to provide a method and an apparatus for diagnosing a fault in a semiconductor device (chip) without applying a bias voltage to the semiconductor device.

According to the present invention, there is provided a method for diagnosing a fault in a semiconductor device, comprising:

a laser applying step of applying a pulse laser beam having a predetermined wavelength to a semiconductor device so as to two-dimensionally scan the semiconductor device with the pulse laser beam, the semiconductor device being held at a state where no bias voltage is applied thereto;

a detection/conversion step of detecting an electromagnetic wave generated from a laser applied position in the semiconductor device, and converting the detected electromagnetic wave into a time-varying voltage signal that corresponds to a time-varying amplitude of an electric field of the electromagnetic wave; and a fault diagnosis step of deriving an electric field distribution in the semiconductor device on the basis of the time-varying voltage signal to perform fault diagnosis on the semiconductor device.

Further, according to the present invention, there is provided an apparatus for diagnosing a fault in a semiconductor device, comprising:

an laser applying unit for applying a pulse laser beam having a predetermined wavelength to a semiconductor device so as to two-dimensionally scan the semiconductor device with the pulse laser beam, the semiconductor device being held at a state where no bias voltage is applied thereto;

a detection/conversion unit for detecting an electromagnetic wave generated from a laser applied position in the semiconductor device, and converting the detected electromagnetic wave into a time-varying voltage signal that corresponds to a time-varying amplitude of an electric field of the electromagnetic wave; and a fault diagnosis unit for deriving an electric field distribution in the semiconductor device on the basis of the time-varying voltage signal to perform fault diagnosis on the semiconductor device.

Even if a bias voltage is not applied to the semiconductor device, a built-in electric field exists at a PN-junction or an interface between a semiconductor and a metal that constitute a MOS transistor.

By the method and apparatus of the present invention, a pulse laser beam is applied to a portion where a built-in electric field is generated in a semiconductor device so that an electromagnetic wave can be generated into a free space. The generated electromagnetic wave is then detected to derive an electric field distribution in the semiconductor device in a noncontact manner. Thereby, it becomes possible to perform a fault diagnosis on a semiconductor device during a manufacturing process therefore without applying a bias voltage, which was difficult in the conventional technique.

According to a preferred embodiment of the present invention, the fault diagnosis step comprises:

a determining step of determining a phase of the time-varying voltage signal;

an imaging step of imaging the electric field distribution in the semiconductor device on the basis of the determined phase depending on an electric field at the position to which the pulse laser beam is applied; and a fault/defect analyzing step of specifying a fault/defect position in the semiconductor device on the basis of the imaged electric field distribution.

Further, according to a preferred embodiment of the present invention, the fault diagnosis unit includes:

a determining unit for determining a phase of the time-varying voltage signal;

an imaging unit for imaging the electric field distribution in the semiconductor device on the basis of the determined phase depending on an electric field at the position to which the pulse laser beam is applied; and a fault/defect analyzing unit for specifying a fault/defect position in the semiconductor device on the basis of the imaged electric field distribution.

Thereby, the electric field distribution in the semiconductor device is imaged to compare this imaged distribution with an electric field distribution image of a quality semiconductor device, for example. In this manner, it is possible to specify a fault/defect position in the semiconductor device.

According to another embodiment of the present invention, the detection/conversion step comprises;

a step of determining a polarization direction of the electromagnetic wave;

a step of imaging an two-dimensional electric field vector distribution in the semiconductor device on the basis of the polarization direction in parallel with the electric field in the semiconductor device; and a step of specifying a fault/defect position in the semiconductor device on the basis of the imaged electric field vector distribution.

According to another embodiment of the present invention, the fault diagnosis unit includes:

a determining unit for determining a polarization direction of the electromagnetic wave;

an imaging unit for imaging an electric field distribution in the semiconductor device on the basis of the determined polarization direction depending on the electric field at a position to which the pulse laser beam is applied; and a fault/defect analyzing unit for specifying a fault/defect position in the semiconductor device on the basis of the imaged electric field distribution.

Thereby, the distribution of the two-dimensional electric field vector can be imaged to more accurately specify a fault/defect position in the semiconductor device on the basis of this vector distribution image.

According to another embodiment of the present invention, the fault diagnosis step comprises:

a step of at a predetermined sampling time, sampling the time-varying voltage signal corresponding to an electric field amplitude of the electromagnetic wave;

a step of deriving the electric field distribution in the semiconductor device on the basis of the sampled electric field amplitude in proportion to an electric field magnitude at a position to the pulse laser beam is applied; and a step of specifying a fault/defect position in the semiconductor device on the basis of the electric field distribution.

Preferably, the fault diagnosis step comprises:

a step of at a plurality of predetermined sampling times, sampling the time-varying voltage signal corresponding to an electric field amplitude of the electromagnetic wave;

a step of deriving the electric field distributions in the semiconductor device respectively corresponding to the plurality of predetermined sampling times, on the basis of the sampled electric field amplitudes in proportion to an electric field magnitude at a position to which the pulse laser beam is applied; and a step of specifying a fault/defect position in the semiconductor device on the basis of the electric field distributions.

Preferably, the method of the present invention is performed during a manufacturing process for the semiconductor device.

Preferably, the predetermined wavelength of the pulse laser beam is not shorter than 300 nanometers, and is not longer than 2 microns, a pulse width of the pulse laser beam is not shorter than 1 femtosecond, and is not longer than 10 picoseconds, and the pulse laser beam is applied to a chip back surface of the semiconductor device.

If the wavelength region of the pulse laser beam is a region larger than 2 microns, time-mean energy is less than 0.1 mW, or a pulse width is shorter than 1 femtosecond, a generated electromagnetic wave is weak to make it difficult to perform fault detection. On the other hand, if the wavelength region of the pulse laser beam is a region less than 300 nanometers, time-mean energy exceeds 10 W, or the pulse width exceeds 10 picoseconds, the intensity of the pulse laser beam is strong enough to cause a possibility that the semiconductor device can be damaged.

When the semiconductor device is an Si device, it is preferable that the predetermined wavelength of the pulse laser beam is not shorter than 1 micron, and is not longer than 2 microns, a pulse width of the pulse laser beam is not shorter than 1 femtosecond, and is not longer than 10 picoseconds, and the pulse laser beam is applied to a chip back surface of the Si device.

When the semiconductor device is an Si device, if the wavelength of the pulse laser beam is longer than 2 microns, or the pulse width of the pulse laser beam is shorter than 1 femtosecond, a generated electromagnetic wave is weak to make it difficult to perform fault detection. On the other hand, when the semiconductor device is an Si device, if the wavelength of the pulse laser beam is shorter than 1 micron, or the pulse width of the pulse laser beam is longer than 10 picoseconds, the intensity of the pulse laser beam is strong enough to cause a possibility that the semiconductor device can be damaged. Furthermore, by applying the pulse laser beam to the back surface of the chip, it possible to securely apply the pulse laser beam to the position where the built-in electric field is generated at the PN-junction, the interface between a metal and a semiconductor, or the like.

Preferably, the fault diagnosis step comprises a step of comparing the derived electric field distribution with an electric field distribution of a quality semiconductor device. Thereby, it is possible to easily specify a fault/defect position in the semiconductor device.

As described above, according to the method and the apparatus of the present invention, it is possible to derive a distribution of a two-dimensional electric field vector in a semiconductor device in a noncontact manner. Furthermore, according to the present invention, fault diagnosis can be performed on a semiconductor device to which a bias voltage is not applied. Thereby, it is possible to easily realize fault/defect position detecting for a semiconductor device during a manufacturing process therefore, which was difficult in the conventional technique.

Other objects, features and advantages of the present invention will become apparent from the following detailed description with reference to the accompanying drawings.

DESCRIPTION OF THE PREFERRED EMBODIMENTS

Hereinafter, the preferred embodiments of the present invention will be described with reference to the accompanying drawings. In the drawings, common portions are designated by the same or similar reference numerals, and overlapping description is omitted.

First, a principle of generating an electromagnetic wave by laser pulse irradiation will be described.

When a laser beam having energy larger than that of a band gap is applied to a portion of a semiconductor where an electric field E exists, a pair of an electron and a hole is generated by photoexcitation, and accelerated by the electric field so that a current can flow.

If the laser beam is continuously applied to the semiconductor, a stationary current flows. If the laser beam of pulse light is applied to the semiconductor, the excitation of a pair of an electron and a hole is weakened to induce no current when a certain period of time elapsed. Thus, a pulse current flows depending on a pulse width of pulse light and a excitation period.

When a current varies with the lapse of time, an electromagnetic wave is generated in accordance with the following equation (1) derived from Maxwell Equation of classical electromagnetism:

$$\vec{E}_{emission} \propto \frac{\partial \vec{J}}{\partial t} \quad (1)$$

$$= \frac{\partial (n e \vec{v})}{\partial t}$$

$$= \frac{\partial (n e \mu \vec{E}_{local})}{\partial t}$$

Here, "$E_{emission}$" designates an electric field vector of an electromagnetic wave, "J" a photocurrent density vector, "n" a density of an excited electron and hole pair, "v" a drifting speed of the electron and hole pair accelerated by an electric field "$E_{local}$" in a semiconductor at a position irradiated with light, and "$\mu$" the electric charge mobility.

As can be understood from the equation (1), the electric field vector of the generated electromagnetic wave is in parallel with an electric field vector in the semiconductor. Accordingly, when $E_{local}$ is set in an opposite direction (i.e., $E_{local}$ is changed to $-E_{local}$), $E_{emission}$ is changed to $-E_{emission}$.

On the assumption that $E_{emission}$ is $E_0 \cos \omega t$ (i.e., $E_{emission} = E_0 \cos \omega t$), $-E_{emission}$ becomes $-E_0 \cos \omega t = E_0 \cos(-\omega t)$ (i.e., $-E_{emission} = -E_0 \cos \omega t = E_0 \cos(-\omega t)$. In other words, the phase of the generated electromagnetic wave is reversed with respect to positive and negative values, reflecting the direction of the electric field vector in the semiconductor. Thus, the phase reflects the direction of the electric field.

Further, it can also be understood from the equation (1) that the amplitude of the generated electromagnetic wave is in proportion to the magnitude of the electric field vector in the semiconductor. In other words, the amplitude is in proportion to the magnitude of the electric field.

It can be understood from the equation (1) that the direction (polarization direction) of the electric field vector of the generated electromagnetic wave is in parallel with the electric field vector in the semiconductor. In other words, the polarization direction is in parallel with the direction of the electric field.

Next, the description will be directed to a reason why the electromagnetic wave is generated from the PN-junction in a state where no bias voltage is applied to the PN-junction.

Figure 5:
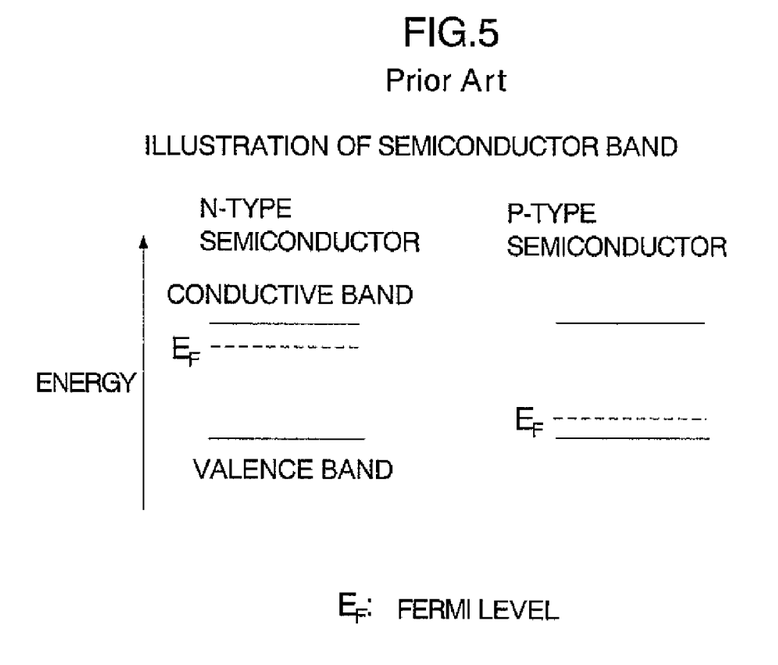
FIG. 5 shows a band in a semiconductor device.

FIG. 5 shows a band in a semiconductor. In FIG. 5, "$E_F$" designates a Fermi level. A P-type semiconductor (where an electron hole functions as a carrier) and an N-type semiconductor (where an electron functions as a carrier) constitute a PN-junction. As shown in FIG. 5, a Fermi level of a P-type semiconductor is different from a Fermi level of an N-type semiconductor.

Figure 6:
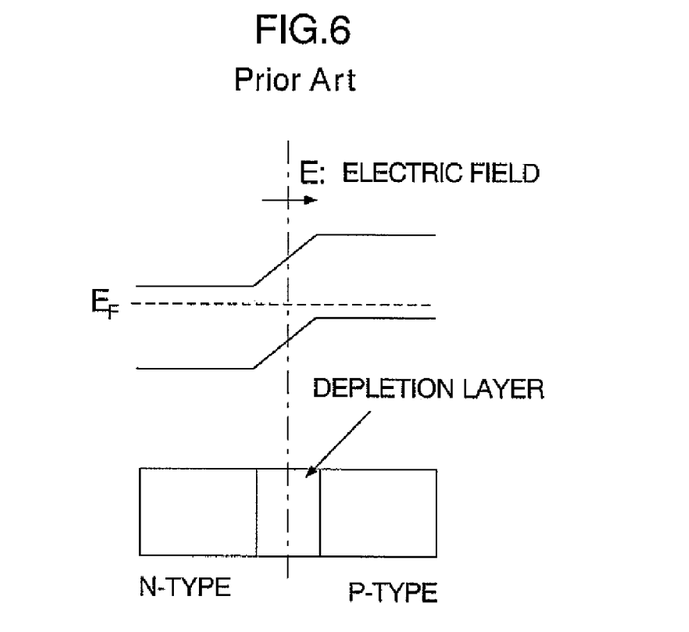
FIG. 6 shows a energy distribution at a PN-junction.

FIG. 6 shows an energy distribution at the PN-junction. When a P-type semiconductor and an N-type semiconductor are bonded to each other, a depletion layer is formed in the vicinity of the junction interface between the P-type and N-type semiconductors at the time of bonding the two semiconductors such that Fermi levels of the P-type and N-type semiconductors can conform to each other (refer to FIG. 6). The depletion layer is a region where no carriers exist, and a built-in electric field E exists. Accordingly, even in a state where no voltage is applied to the PN-junction from the outside thereof, an electric field constantly exists at the depletion layer of the PN-junction. When the depletion layer of the PN-junction is irradiated with light, a pair of an electron and a hole is generated so that an electromagnetic wave can be generated in accordance with the above equation (1).

It is known that the built-in electric field is not limited to the PN-junction, that is, the built-in electric field is generated also in the interface between a metal and semiconductor or the like that constitute a MOS transistor in a semiconductor device to which no bias voltage is applied.

Figure 7:
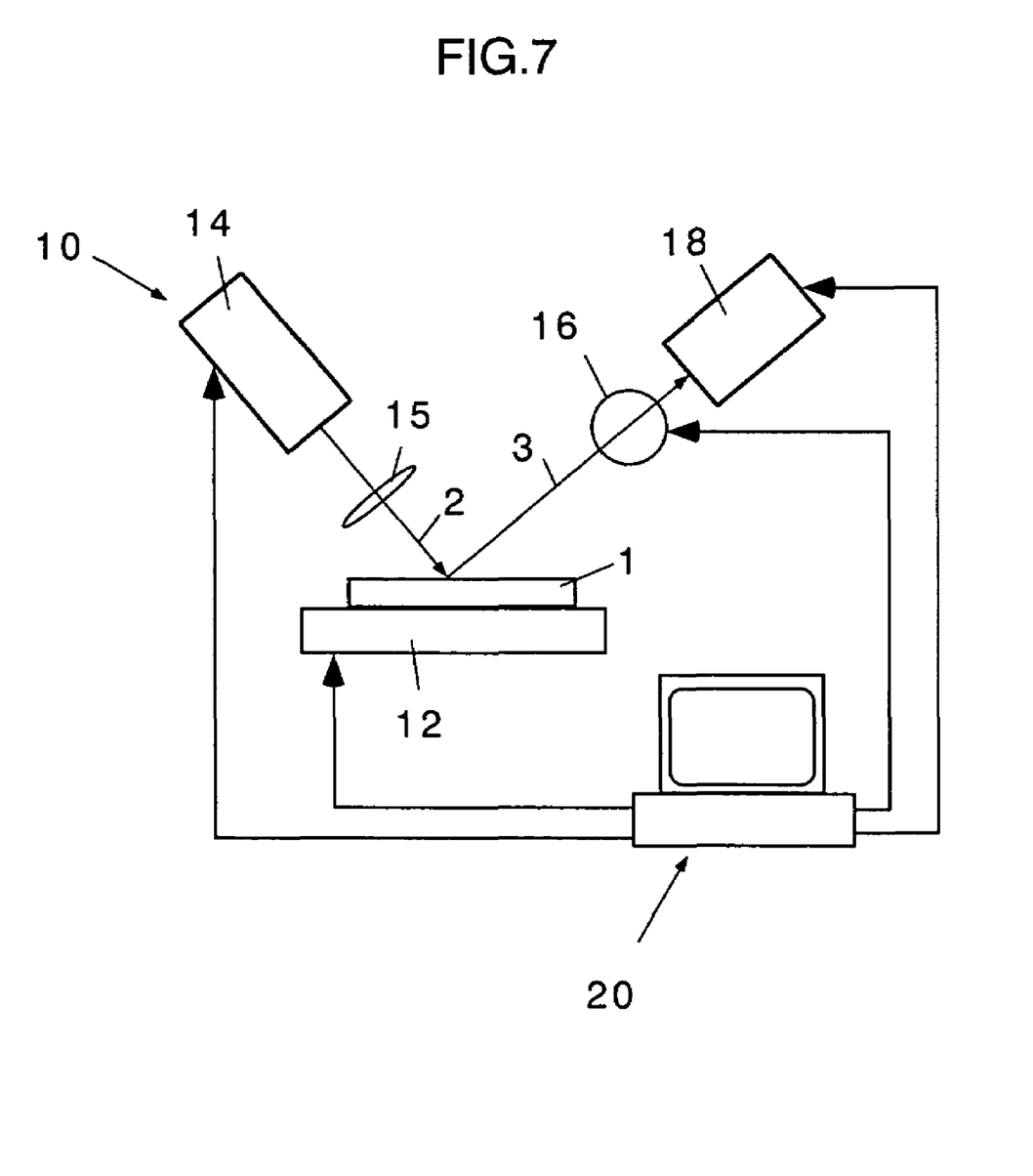
FIG. 7 schematically shows an apparatus for diagnosing a fault in a semiconductor device according to an embodiment of the present invention.

FIG. 7 schematically shows an apparatus for diagnosing a fault in a semiconductor device according to an embodiment of the present invention. As shown in FIG. 7, the fault diagnosing apparatus 10 includes a laser applying unit, a detection/conversion unit 18, and a fault diagnosis unit 20.

Referring to FIG. 7, the laser applying unit includes a device scanning base 12, a pulse laser beam source 14, and a condenser lens 15. This laser applying unit generates pulse laser beam 2 of a predetermined wavelength to scan a semiconductor device 1 two-dimensionally with the pulse laser beam 2, in a state where no bias voltage is applied to the semiconductor device 1.

The device scanning base 12 holds the semiconductor device 1 without applying a bias voltage to the semiconductor device 1, and two-dimensionally moves the semiconductor device 1 so that the semiconductor device 1 can be scanned with the pulse laser beam 2. It should be noted that the present invention is not limited to this configuration. For example, a swing mirror (not shown) is swung so as to two-dimensionally scan the two-dimensional circuit on the semiconductor device 1 with the pulse laser beam 2. The pulse laser beam source 14 generates the pulse laser beam 2, and the condenser lens 15 condenses the pulse laser beam 2 on the two-dimensional circuit on the semiconductor device 1. It is preferable to apply the pulse laser beam 2 to the back surface of the semiconductor device chip in order to prevent the semiconductor device 1 to be damaged, and to securely apply the pulse laser beam 2 to the position of the built-in electric field generated at the PN-junction, a metal/semiconductor interface and the like.

The pulse laser beam source 14 is preferably a mode locking titanium sapphire laser or a femtosecond fiber laser capable of generating the pulse laser beam 2.

Preferably, the wavelength region of the pulse laser beam 2 is from 300 nanometers (300 nm=0.3 μm) through 2 microns (2 μm). Preferably, the time-mean energy of the pulse laser beam 2 is from 0.1 mW through 10 W. Furthermore, preferably, the pulse width of the pulse laser beam 2 is from 1 femtosecond (1 fs=0.001 ps) through 10 picoseconds (10 ps).

That is, use of a small-width pulse laser as a light source enables an electromagnetic wave to be generated without much affecting an integrated circuit. An estimated value of the maximum light pulse width that dose not thermally affect the integrated circuit is about 10 picoseconds.

If the wavelength region of the pulse laser beam 2 is a region larger than 2 microns, time-mean energy is less than 0.1 mW, or a pulse width is shorter than 1 femtosecond, a generated electromagnetic wave 3 is weak to make it difficult to perform fault detection. On the other hand, if the wavelength region of the pulse laser beam 2 is a region less than 300 nanometers, time-mean energy exceeds 10 W, or the pulse width exceeds 10 picoseconds, the intensity of the pulse laser beam 2 is strong enough to cause a possibility that the semiconductor device 1 can be damaged.

In FIG. 7, the detection/conversion unit 18 is an electromagnetic wave detection bolometer or a semiconductor optical switch, for example. This detection/conversion unit 18 detects the electromagnetic wave 3 generated from the position to which the pulse laser beam 2 is applied, and converts the detected electromagnetic wave 3 into a time-varying voltage signal that corresponds to the time-varying waveform of the electric field amplitude of the electromagnetic wave 3.

In FIG. 7, the reference numeral 16 designate a polarizer for determining a polarization direction of the electromagnetic wave 3.

The fault diagnosis unit 20 derives a distribution of an electric field in the semiconductor device on the basis of the voltage signal obtained by the detection/conversion unit 18 to perform fault diagnosis for the semiconductor device 1. In this example, the fault diagnosis unit 20 is a computer (PC) that controls the device scanning base 12 and the pulse laser beam source 14.

The fault diagnosis unit 20 includes a determining unit, an imaging unit and a fault/defect analyzing unit. The determining unit determines a phase of the time-varying voltage signal. The imaging unit images the distribution of the electric field in the semiconductor device 1 by taking advantage of the above-described nature that the phase determined by the determining unit depends on the electric field at the position to which pulse laser beam 2 is applied. The fault/defect analyzing unit specifies a fault/defect position in the semiconductor device 1 on the basis of the imaged electric field distribution. The imaged electric field distribution is displayed on a CRT of the fault diagnosis unit 20. This imaged electric field distribution is compared with a similar electric field distribution obtained from a normal semiconductor device 1 so that if a fault/defect position exists, a change in the electric field distribution appears at the fault/defect position. In this manner, it is possible to specify the fault/defect position in the semiconductor device 1.

Figure 8:
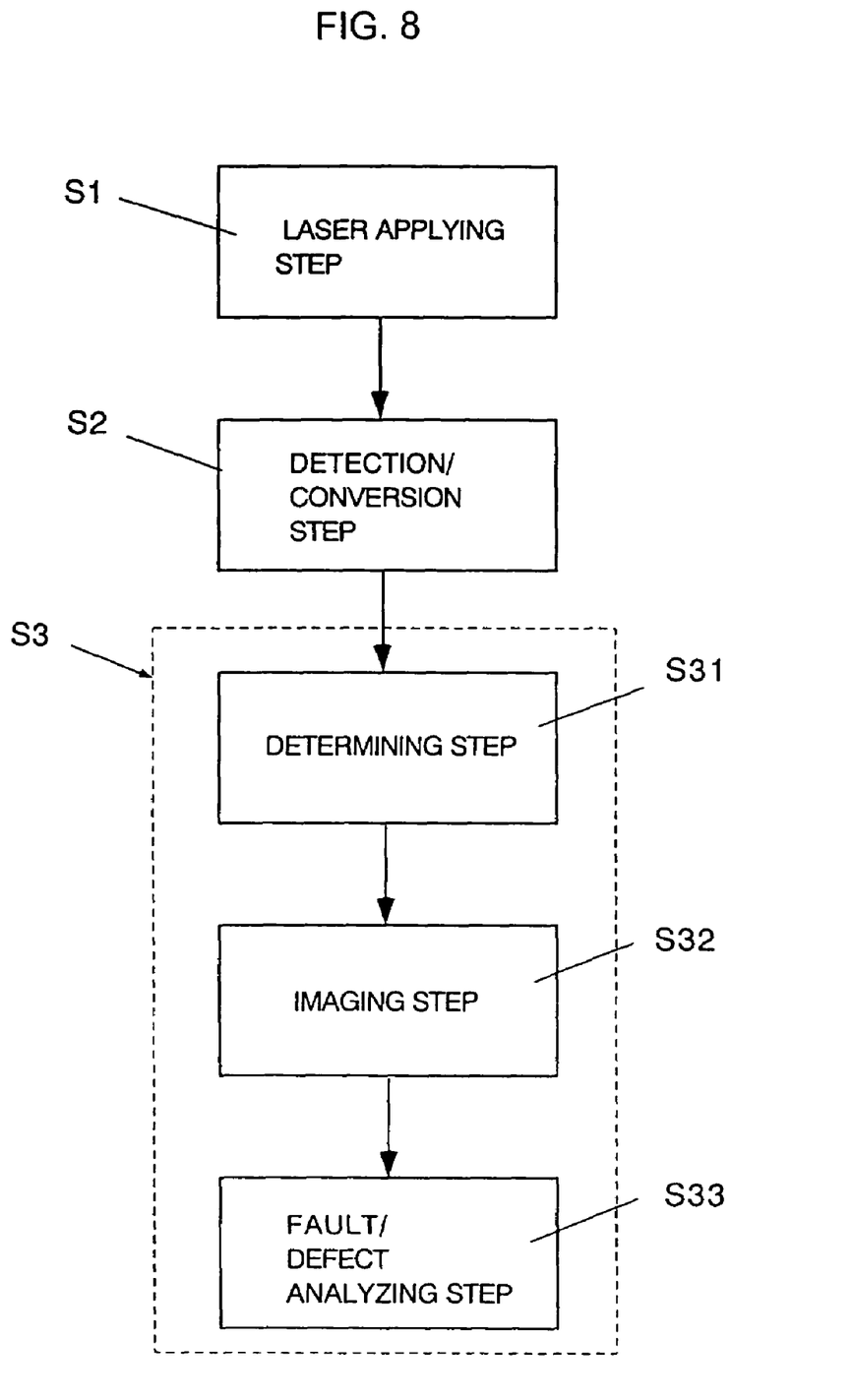
FIG. 8 is a flowchart showing a method for diagnosing a fault in a semiconductor device according to an embodiment of the present invention.

FIG. 8 is a schematic flowchart showing a method for diagnosing a fault in the semiconductor device according to the embodiment of the invention. As shown in FIG. 8, the fault diagnosing method includes a laser applying step S1, a detection/conversion step S2, and a fault disgnosis step S3.

In the laser applying step S1, by using the above-described fault diagnosing apparatus 10, a semiconductor device 1 held at a state where no bias voltage is applied to the semiconductor device 1. Subsequently, in the step S1, this semiconductor device 1 is two-dimensionally scanned with the pulse laser beam 2 having a predetermined wavelength.

In the detection/conversion step S2, the electromagnetic wave 3 is detected. This detected electromagnetic wave 3 is generated from the position to which the pulse laser beam 2 is applied. Further, in the step S2, the detected electromagnetic wave is converted into a time-varying voltage signal that corresponds to the time-varying amplitude of the electric field of the electromagnetic wave 3.

In the fault diagnosis step S3, the electric field distribution in the semiconductor device is derived on the basis of the voltage signal so that fault diagnosis can be performed.

In this example, the fault diagnosis step S3 includes a determining step S31, an imaging step S32 and a fault/defect analyzing step S33. In the determining step S31, the phase of the time-varying voltage signal is determined. In the imaging step S32, the distribution of the electric field in the semiconductor device 1 is imaged by taking advantage of the above-described nature that the phase determined by the determining unit depends on the electric field at the position to which the pulse laser beam 2 is applied. In the fault/defect analysis step S33, a fault/defect position in the semiconductor device is specified from the obtained image.

Furthermore, in the detection/conversion step S2, a polarization direction of the electromagnetic wave may be determined by using the polarizer 16. In this case, in the determining step S31, the polarization direction of the electromagnetic wave is determined. Thereby, the distribution of a two-dimensional electric field vector in the semiconductor device is imaged by taking advantage of the above-described nature that the polarization direction is in parallel with the electric field in the semiconductor device 1. Then, a fault/defect position in the semiconductor device is specified from the imaged electric field vector distribution. Thus, the determining unit may be constituted by the polarizer 16 to determine the polarization direction of the electromagnetic wave, instead of or in addition to the determining of the time-varying voltage signal phase.

The fault diagnosis step S3 may include a sampling step in which an amplitude of the time-varying voltage signal that corresponds to the electric field of the electromagnetic wave is sampled at a predetermined sampling time. Then, the distribution of the electric field in the semiconductor device 1 is obtained by taking advantage of the above-described nature that the sampled amplitude of the electric field of the electromagnetic wave is in proportion to the magnitude of the electric field at the position to which the pulse laser beam 2 is applied. In this manner, it is possible to specify a fault/defect position in the semiconductor device 1 on the basis of the obtained electric field distribution.

Preferably, the time-varying voltage signal corresponding to the time-varying electric field of the electromagnetic wave is sampled at a plurality of predetermined sampling times to obtain a plurality of distributions of electric field in the semiconductor device 1. These obtained electric field distributions correspond to a plurality of the predetermined different sampling times, respectively. In this manner, it is possible to specify a fault/defect position in the semiconductor device 1 on the basis of a plurality of the obtained electric field distributions in the semiconductor device 1.

According to the fault diagnosing apparatus and method in the above-described embodiment of the present invention, a pulse laser beam is applied to a portion in the semiconductor device where the built-in electric filed is generated. Thereby, an electromagnetic wave is generated into a free space from the pulse laser beam applied portion, and the generated electromagnetic wave is detected so that the electric field in the semiconductor device can be obtained in a noncontact manner. Accordingly, on the basis of the obtained electric field distribution, it is possible to perform a fault diagnosis on the semiconductor device in the course of a manufacturing process thereof in a condition that no bias voltage is applied to the semiconductor device. Thus, the present invention enables fault diagnosis in the course of the manufacturing process, which has been difficult in the conventional technique.

The present invention is not limited to the above-described embodiment, and it is apparent that the above-described embodiment of the present invention can be modified in various manners without departing from the scope of the present invention.

What is claimed is:

1. A method for diagnosing a fault in a semiconductor device, comprising:
    a laser applying step of applying a pulse laser beam having a predetermined wavelength to a semiconductor device so as to two-dimensionally scan the semiconductor device with the pulse laser beam, wherein a pulse width of the pulse laser beam is not shorter than 1 femtosecond, and is not longer than 10 picoseconds, and the semiconductor device is held at a state where no bias voltage is applied thereto;
    a detection/conversion step of detecting an electromagnetic wave generated by an optical beam induced current change produced at a laser applied position in the semiconductor device, and converting the detected electromagnetic wave into a time-varying voltage signal that corresponds to a time-varying amplitude of an electric field of the electromagnetic wave; and
    a fault diagnosis step of deriving an electric field distribution in the semiconductor device on the basis of the time-varying voltage signal to perform fault diagnosis on the semiconductor device.

2. A method for diagnosing a fault in a semiconductor device according to claim 1, the fault diagnosis step comprising:
    a determining step of determining a phase of the time-varying voltage signal;
    an imaging step of imaging the electric field distribution in the semiconductor device on the basis of the determined phase depending on an electric field at the position to which the pulse laser beam is applied; and
    a fault/defect analyzing step of specifying a fault/defect position in the semiconductor device on the basis of the imaged electric field distribution.

3. A method for diagnosing a fault in a semiconductor device according to claim 1, the detection/conversion step comprising;
    a step of determining a polarization direction of the electromagnetic wave;
    a step of imaging an two-dimensional electric field vector distribution in the semiconductor device on the basis of the polarization direction in parallel with the electric field in the semiconductor device; and
    a step of specifying a fault/defect position in the semiconductor device on the basis of the imaged electric field vector distribution.

4. A method for diagnosing a fault in a semiconductor device according to claim 1, the fault diagnosis step comprising:
    a step of at a predetermined sampling time, sampling the time-varying voltage signal corresponding to an electric field amplitude of the electromagnetic wave;
    a step of deriving the electric field distribution in the semiconductor device on the basis of the sampled electric field amplitude in proportion to an electric field magnitude at a position to the pulse laser beam is applied; and
    a step of specifying a fault/defect position in the semiconductor device on the basis of the electric field distribution.

5. A method for diagnosing a fault in a semiconductor device according to claim 1, the fault diagnosis step comprising:
    a step of at a plurality of predetermined sampling times, sampling the time-varying voltage signal corresponding to an electric field amplitude of the electromagnetic wave;
    a step of deriving the electric field distributions in the semiconductor device respectively corresponding to the plurality of predetermined sampling times, on the basis of the sampled electric field amplitudes in proportion to an electric field magnitude at a position to which the pulse laser beam is applied; and a step of specifying a fault/defect position in the semiconductor device on the basis of the electric field distributions.

6. A method for diagnosing a fault in a semiconductor device according to claim 1, being performed during a manufacturing process for the semiconductor device.

7. A method for diagnosing a fault in a semiconductor device according to claim 1, wherein the predetermined wavelength of the pulse laser beam is not shorter than 300 nanometers, and is not longer than 2 microns, and the pulse laser beam is applied to a chip back surface of the semiconductor device.

8. A method for diagnosing a fault in a semiconductor device according to claim 1, wherein the semiconductor device is an Si device, the predetermined wavelength of the pulse laser beam is not shorter than 1 micron, and is not longer than 2 microns, and the pulse laser beam is applied to a chip back surface of the Si device.

9. A method for diagnosing a fault in a semiconductor device according to claim 1, the fault diagnosis step comprising a step of comparing the derived electric field distribution with an electric field distribution of a quality semiconductor device.

10. An apparatus for diagnosing a fault in a semiconductor device, comprising:

an laser applying unit for applying a pulse laser beam having a predetermined wavelength to a semiconductor device so as to two-dimensionally scan the semiconductor device with the pulse laser beam, wherein a pulse width of the pulse laser beam is not shorter than 1 femtosecond and is not longer than 10 picoseconds, and the semiconductor device is held at a state where no bias voltage is applied thereto;

a detection/conversion unit for detecting an electromagnetic wave generated by an optical beam induced current change produced at a laser applied position in the semiconductor device, and converting the detected electromagnetic wave into a time-varying voltage signal that corresponds to a time-varying amplitude of an electric field of the electromagnetic wave; and a fault diagnosis unit for deriving an electric field distribution in the semiconductor device on the basis of the time-varying voltage signal to perform fault diagnosis on the semiconductor device.

11. An apparatus for diagnosing a fault in a semiconductor device according to claim 10, wherein the fault diagnosis unit includes:

a determining unit for determining a phase of the time-varying voltage signal;

an imaging unit for imaging the electric field distribution in the semiconductor device on the basis of the determined phase depending on an electric field at the position to which the pulse laser beam is applied; and a fault/defect analyzing unit for specifying a fault/defect position in the semiconductor device on the basis of the imaged electric field distribution.

12. An apparatus for diagnosing a fault in a semiconductor device according to claim 10, wherein the fault diagnosis unit includes:

a determining unit for determining a polarization direction of the electromagnetic wave;

an imaging unit for imaging an electric field distribution in the semiconductor device on the basis of the determined polarization direction depending on the electric field at a position to which the pulse laser beam is applied; and a fault/defect analyzing unit for specifying a fault/defect position in the semiconductor device on the basis of the imaged electric field distribution.

13. An apparatus for diagnosing a fault in a semiconductor device according to claim 10, wherein the laser applying unit generates the pulse laser beam having:

the predetermined wavelength that is not shorter than 300 nanometers, and is not longer than 2 microns; and the laser applying unit applies the pulse laser beam to a chip back surface of the semiconductor device.

14. An apparatus for diagnosing a fault in a semiconductor device according to claim 10, wherein the semiconductor device is an Si device, the laser applying unit generates the pulse laser beam having:

the predetermined wavelength that is not shorter than 1 micron, and is not longer than 2 microns; and the laser applying unit applies the pulse laser beam to a chip back surface of the Si device.

15. A method for diagnosing a fault in a semiconductor device, comprising the steps of:

applying a pulse laser beam having a predetermined wavelength to a semiconductor device so as to two-dimensionally scan the semiconductor device with the pulse laser beam, wherein a pulse width of the pulse laser beam is not shorter than 1 femtosecond and is not longer than 10 picoseconds, and the semiconductor device is held at a state where no bias voltage is applied thereto;

detecting an electromagnetic wave generated by an optical beam induced current change produced at a laser applied position in the semiconductor device, and converting the detected electromagnetic wave into a time-varying voltage signal that corresponds to a time-varying amplitude of an electric field of the electromagnetic wave; and deriving an electric field distribution in the semiconductor device on the basis of the time-varying voltage signal to perform fault diagnosis on the semiconductor device.

* * * * *